(12) United States Patent
Meyers et al.

(10) Patent No.: US 10,964,682 B2
(45) Date of Patent: Mar. 30, 2021

(54) DATA STORAGE SYSTEM USING WAFER-LEVEL PACKAGING

(71) Applicant: Intel Corporation, Santa Clara, CA (US)

(72) Inventors: John G. Meyers, Sacramento, CA (US); Leo J. Craft, Shingle Springs, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/323,749

(22) PCT Filed: Sep. 30, 2016

(86) PCT No.: PCT/US2016/054687
§ 371 (c)(1),
(2) Date: Feb. 6, 2019

(87) PCT Pub. No.: WO2018/063292
PCT Pub. Date: Apr. 5, 2018

(65) Prior Publication Data
US 2019/0172820 A1 Jun. 6, 2019

(51) Int. Cl.
*H01L 25/00* (2006.01)
*H01L 25/18* (2006.01)
*H01L 23/31* (2006.01)
*H01L 25/065* (2006.01)
*H01L 23/28* (2006.01)
(Continued)

(52) U.S. Cl.
CPC .............. *H01L 25/18* (2013.01); *H01L 23/28* (2013.01); *H01L 23/3114* (2013.01); *H01L 23/481* (2013.01); *H01L 23/522* (2013.01); *H01L 23/5226* (2013.01); *H01L 23/535* (2013.01); *H01L 25/0652* (2013.01); *H01L 27/1052* (2013.01); *H05K 7/1424* (2013.01); *G11C 5/02* (2013.01); *G11C 5/06* (2013.01);
(Continued)

(58) Field of Classification Search
CPC . H01L 27/14687; H01L 27/1052; G11C 5/02; G11C 5/06; H05K 7/1452
See application file for complete search history.

(56) References Cited

U.S. PATENT DOCUMENTS 4,471,483 A * 9/1984 Chamberlain ........... G11C 5/06
714/718
4,489,397 A * 12/1984 Lee ................ G01R 31/318505
712/15
(Continued)

OTHER PUBLICATIONS

International Search Report and Written Opinion for International Patent Application No. PCT/US2016/054687 dated Jun. 21, 2017, 14 pgs.
(Continued)

*Primary Examiner* — Nicholas J Tobergte
(74) *Attorney, Agent, or Firm* — Schwabe, Williamson & Wyatt, P.C.

(57) ABSTRACT

A data storage system is described that uses wafer-level packaging. In one embodiment an apparatus includes a silicon wafer, a plurality of memory cells formed directly on the wafer, an encapsulant formed over the memory cells, a plurality of wiring connections to connect the memory cells to an external interface, a memory controller, and an external interface.

19 Claims, 4 Drawing Sheets

(51) Int. Cl.
    *H01L 23/522*     (2006.01)
    *H01L 23/48*     (2006.01)
    *H01L 23/535*     (2006.01)
    *H01L 27/105*     (2006.01)
    *H05K 7/14*     (2006.01)
    *G11C 5/02*     (2006.01)
    *G11C 5/06*     (2006.01)
    *H01R 12/73*     (2011.01)
    *H05K 7/20*     (2006.01)

(52) U.S. Cl.
    CPC .......... *H01R 12/737* (2013.01); *H05K 7/1447* (2013.01); *H05K 7/1452* (2013.01); *H05K 7/20136* (2013.01)

(56) References Cited

U.S. PATENT DOCUMENTS

| | | | | |
|---|---|---|---|---|
| 4,493,055 A * | 1/1985 | Osman | ................... | G11C 5/06 |
| | | | | 365/174 |
| 4,559,626 A * | 12/1985 | Brown | ................... | G11C 29/56 |
| | | | | 714/48 |
| 4,675,717 A * | 6/1987 | Herrero | ................ | H01L 23/147 |
| | | | | 257/691 |
| 4,920,454 A * | 4/1990 | Stopper | .................. | H01L 22/32 |
| | | | | 174/561 |
| 5,287,472 A * | 2/1994 | Horst | ................... | G11C 29/006 |
| | | | | 365/189.03 |
| 5,309,011 A * | 5/1994 | Tazunoki | .............. | H01L 23/147 |
| | | | | 257/390 |
| 5,463,249 A * | 10/1995 | Shinbo | ................ | H01L 23/5385 |
| | | | | 257/690 |
| 5,514,884 A * | 5/1996 | Hively | ................... | G11C 5/025 |
| | | | | 257/203 |
| 6,640,272 B1 | 10/2003 | Hartwell et al. | | |
| 8,106,488 B2 | 1/2012 | Chua et al. | | |
| 8,242,382 B2 * | 8/2012 | van den Hoek | ..... | H05K 3/4038 |
| | | | | 174/262 |
| 8,546,189 B2 | 10/2013 | Camacho et al. | | |
| 8,779,576 B2 | 7/2014 | Park et al. | | |
| 9,164,554 B2 * | 10/2015 | Bruening | ................ | G06F 1/185 |
| 10,304,802 B2 * | 5/2019 | Emma | ................ | H01L 25/0657 |
| 2004/0046250 A1* | 3/2004 | Chua | ................... | H01L 23/5389 |
| | | | | 257/723 |
| 2004/0156640 A1* | 8/2004 | Dress | ...................... | G06E 3/006 |
| | | | | 398/140 |
| 2010/0246152 A1* | 9/2010 | Lin | ....................... | H01L 21/563 |
| | | | | 361/783 |
| 2017/0269871 A1* | 9/2017 | Khan | ................... | G06F 3/0619 |

OTHER PUBLICATIONS

International Preliminary Report on Patentability for International Patent Application No. PCT/US2016/054687, dated Apr. 11, 2019, 11 pgs.

* cited by examiner

DATA STORAGE SYSTEM USING WAFER-LEVEL PACKAGING

CROSS-REFERENCE TO RELATED APPLICATION

This patent application is a U.S. National Phase Application under 35 U.S.C. § 371 of International Application No. PCT/US2016/054687, filed Sep. 30, 2016, entitled "DATA STORAGE SYSTEM USING WAFER-LEVEL PACKAGING," which designates the United States of America, the entire disclosure of which is hereby incorporated by reference in its entirety and for all purposes.

FIELD

The present description pertains to the field of data storage systems, and in particular to a system with wafer level packaging for memory devices.

BACKGROUND

High capacity, high speed, and low power memory is in demand for many different high powered computing systems, such as servers, entertainment distribution head ends for music and video distribution and broadcast, and super computers for scientific, prediction, and modeling systems. The leading approach to provide this memory is to mount a large number of memory drives in a rack mounted chassis. The memory drives may use spinning hard disk, flash, or perhaps other memory technologies. The chassis has a backplane to connect to each memory drive and to connect the drives to other rack mounted chassis for computation or communication. The memory drives connect using SAS (Serial Attached SCSI (Small Computer System Interface)), SATA (Serial Advanced Technology Attachment), or PCIe (Peripheral Component Interface express) or other storage interfaces.

For solid state memory, all of the memory cells are formed on a wafer. The wafer is then diced and each die is packaged. In some cases, the dies are packaged individually and in other cases, the dies are stacked into groups and a group of cells are packaged. This solution includes 3PCBs, with the bottom PCB requiring very complex 16 layer technology. The packaged dies are then combined into a system. In some products numerous NAND memory media packages are mounted to a printed circuit board and more packages may be mounted on a middle board and bottom board. The SSD's ASIC memory controller and any other components such as power supplied and management circuits are also mounted to one of the boards. The boards are connected electrically and mechanically with a connector and may be covered by a housing. The memory packages, boards, controllers, connectors, and housing are all adapted for operate as a single system.

BRIEF DESCRIPTION OF THE DRAWINGS

Embodiments are illustrated by way of example, and not by way of limitation, in the figures of the accompanying drawings in which like reference numerals refer to similar elements.

DETAILED DESCRIPTION

As described herein, an SSD storage system is fabricated using the memory wafer itself, without dicing, as the physical and electrical substrate for the system. This avoids or limits the use of PCBs, individually packaged memory packages, and other discrete components. The system may be in the form of a storage wafer as the electrical and physical substrate for a high performance storage system. Such a storage wafer is particularly well-suited to datacenter, cloud servers and other applications that use datacenter class SSD's for ultra-high performance memory. A new class of data center architecture may be constructed using this system.

High performance datacenter class Solid State Drive (SSD) storage presents unique challenges because of the large amount of high speed memory that is desired. Demands are so high that a single memory array may be able to use all of the memory that can be fabricated on a wafer. In some cases, more than one wafer full of memory may be required. As an example, when all of the individual dies are combined, a single 300 mm NAND memory wafer may contain 2-4 TB of storage cells. A PCI-based memory add on card may have the same capacity. In essence, all of the chips produced by a single wafer may be diced up, packaged and combined into a single add-on card.

With a packaged die, there is a product development lead time to qualify the individual die-based memory silicon and its packaging, and then to integrate the packages into a PCB board-based SSD storage. This development time is necessary to ensure that the storage system complies with traditional form factors, such as SSD Add In Card (AIC) or 2.5" disk drive form factors and with traditional connector interfaces, such as SATA (Serial Advanced Technology Attachment), PCI (Peripheral Component Interface), SCSI (Small Computer System Interface), or other interfaces. This development requires time and engineering resources to develop, manage and qualify each of these elements of the final product.

The resulting product suffers from performance limitations caused by the very long signal paths through the SSD, or other board-based, memory controller package, through the SSD circuit board, and then to and from each other memory package substrate and any wirebonds or other connectors within each memory package.

According to embodiments described herein, the cost of dicing and packaging individual memory dies, PCB boards, assembly and other hardware is avoided. A memory wafer, molded or encapsulated, provides the memory storage for the system, as well as the physical and electrical substrate for a complete SSD, or other memory, system. The wafer may use existing wafer scale packaging technologies such as bumping, RDL (Redistribution Layer), encapsulation, TSV (Through-Silicon Via) etc. to make connections between memory circuits and to external components. These technologies are applied to a wafer that remains in wafer form in the final product.

The single wafer has higher performance, because most or all of the data channels are built on the silicon wafer. The speed restriction of relatively lower performance organic package substrates and PCBs is avoided. The packaging cost and most or all of the system and PCB engineering costs are avoided. The system also required less material by avoiding packaging and PCBs, reducing cost and waste at end of life. The single wafer SSD may have a faster time to market because packages and PCB boards do not require qualification. In addition, a planar layout on a wafer allows for better cooling than packaged dies, especially for the critical memory controller.

Figure 1:
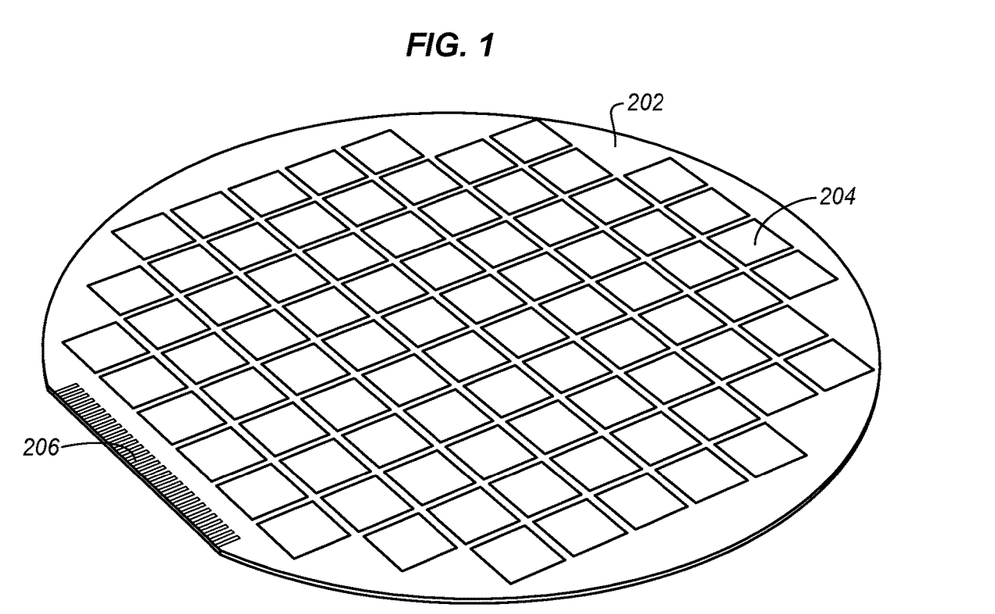
FIG. 1 is an isometric diagram of a wafer level memory storage system with an end connector according to an embodiment.

FIG. 1 is an isometric view diagram of a silicon wafer 202 having a many memory dies 204 formed on its surface. The memory dies each have thousands or millions of memory cells with read, write and related circuitry. The dies may be diced from the wafer and packaged, however in this case, the wafer is left intact. The dies may be formed individually with spacing between each die to accommodate saw kerfs if the dies were to be separated, although they are not. This allows existing memory die designs to be used. Alternatively, the wafer may be laid out with memory blocks that do not reflect divisions into separable dies.

The memory cells may be formed of NAND or NOR flash, of MRAM (Magnetic Random Access Memory), memristor memory, PCM (Phase Change Memory), DRAM (Dynamic Random Access Memory) or any other type of memory, or there may be a mixture of different types to serve different functions for a connected server or other processor. Some of the memory cell types may be selected for speed, while other are selected to be non-volatile, while other are selected for stability. This may all be combined on a single wafer. The memory cells may be formed using a planar semiconductor technology, such as CMOS (Complementary Metal Oxide Semiconductor) or a vertical technology, such as FinFET (Fin Field Effect Transistor) or any other suitable fabrication technology or combinations thereof. The memory wafer may be configured on the wafer using current die-based layouts and connected at the wafer level using RDL (Re-Distribution Layer) or other wafer level interconnect technology.

The wafer memory array includes an external connector 206 in the form of an integral edge connector formed on the wafer to connect the multiple dies, blocks, or cells to any external processing resource. The wafer may be attached to a server, workstation, or memory system using the connector and power and data signals may be communicated with the memory wafer through the connector. The connector may be coupled to the memory cells using traces or paths on the wafer or through wiring layers that are formed over the memory cells in, for example, a redistribution layer.

The memory wafer may be covered in a molding compound, encapsulant or other protective material to physically and electrically isolate the memory wafer from any external damage. The wafer substrate may also be used as the physical and electrical substrate for the complete SSD system. The wafer may use existing wafer scale packaging technologies such as bumping, RDL, encapsulation, TSV (Through-Silicon Via), etc. to provide additional connection and capabilities.

Figure 2:
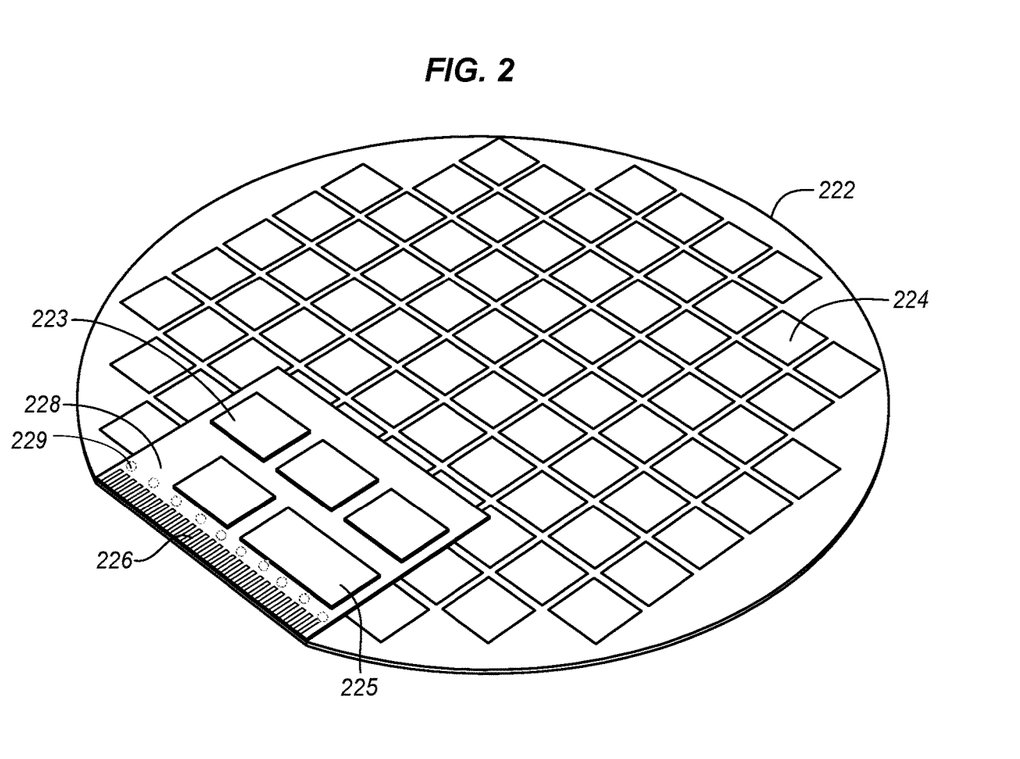
FIG. 2 is an isometric diagram of a wafer level memory storage system with a controller card and connector according to an embodiment.

FIG. 2 is an isometric view diagram of an alternative to the memory wafer of FIG. 1. In this embodiment, the memory wafer 222, similar to that of FIG. 1, has multiple memory dies, or blocks 224 formed on the wafer. The memory dies are connected to a substrate module 228 using a bumped attachment 229 (shown with dashed lines to indicate location beneath substrate module 228) to the storage wafer or using vias. The substrate module is attached to the wafer over the wafer. There may be additional memory dies or memory blocks formed on the module before the module is attached. Front side pads may also be used on the wafer to provide pads to attach and electrically connect the substrate module to the wafer. The substrate module includes memory controllers 223 to buffer and control read and write operations to the memory cells on the wafer. The substrate module also includes an edge connector 226 for external connection to, for example, a server. Data interface modules 225 between the connector and the memory controllers perform formatting, timing, and other interface conversions with the data to and from the external agent.

Figure 3:
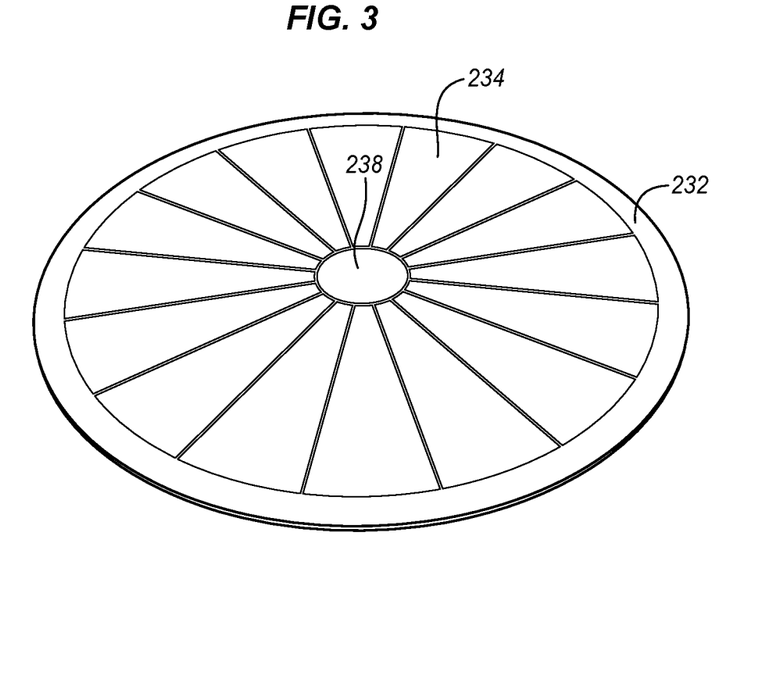
FIG. 3 is an isometric diagram of an alternative wafer level memory storage system according to an embodiment.

FIG. 3 is an isometric view diagram of a further alternative memory wafer. The wafer 232 has multiple memory dies or block 234 of one or more different types as described above. In this embodiment, the memory controller 238 is formed on the silicon wafer in the center of the wafer. The memory wafer is specifically arranged so that the memory channels 234 are in pie-shaped sectors. This may be used to eliminate any need for RDL or other non-silicon interconnects. The pie-shaped sectors each communicate with the central memory controller 238 through connections formed in the silicon. The space that used be used for saw kerf is not needed because the wafer will not be diced. This configuration provides improved performance, testability, and system integration and miniaturization.

Figure 4:
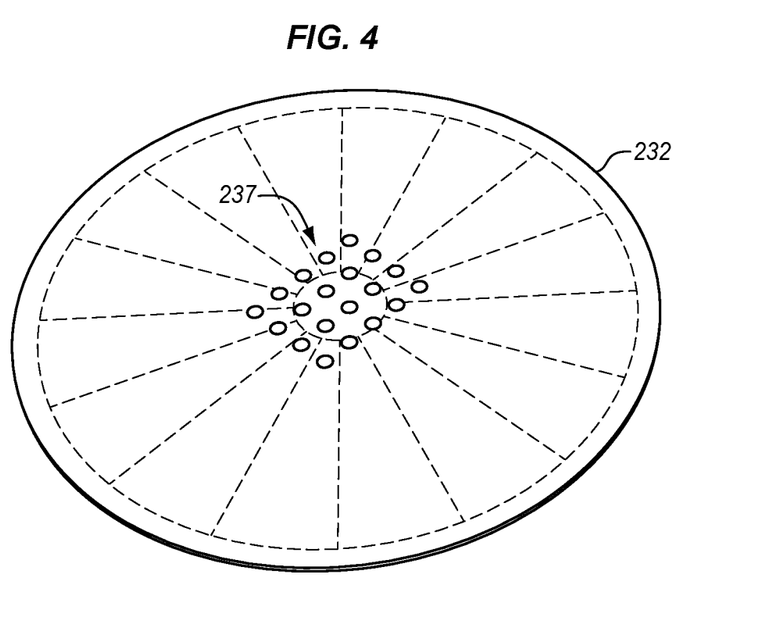
FIG. 4 is an isometric diagram of an opposite side of the wafer level memory storage system of FIG. 3 according to an embodiment.

FIG. 4 is an isometric view of the opposite side of the wafer 232 of FIG. 3. Rather than use an edge connector as in other examples, a set of vias 237 are formed from the memory controller on the top or front side of the wafer through the wafer to the back side. A separate controller or a connector (not shown) may be coupled to the vias to then interface with the datacenter server in one direction and in the other direction with the top side memory controller 238 through the TSVs.

The wafer of this or any other of the figures may be reinforced by attaching a frame to either the bottom or top side of the wafer. In this example, the frame may be represented by the dotted lines on the underside of the wafer. The frame may be formed of a suitable strong, still, and light metal, such as aluminum or it may be cast from a ceramic, polymer, or amorphous material. The frame allows the wafer to be safely handled without risk of bending or cracking. As shown the frame may have a central body an outer periphery and spokes connecting the two. Any other shape may be used as desired.

Figure 5:
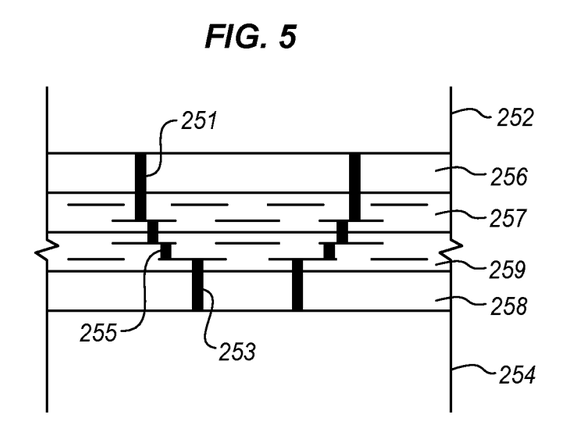
FIG. 5 is a partial cross-sectional view diagram of stacked wafer-level memory storage systems connected with intermediate layers according to an embodiment.

For increased memory capacity, multiple memory wafers may be electrically and physically bonded together at a memory wafer fab. The wafers may be connected using various wafer-based technologies such as string stacking, TSV, RDL etc. FIG. 5 is a partial cross-sectional diagram of a first wafer 252 stacked over a second wafer 254 so that the front side of each wafer is facing the other wafer.

The wafers are both covered in an encapsulant 256, 258. A multi-level RDL 257, 259 is formed over the encapsulant with wiring layers isolated by dielectric. The wafers are then attached together with the RDL of each wafer facing the RDL of the other. Pads formed on the top of the RDL then connect the two wafers together. TSVs allow vias through the encapsulant 253 and through the RDL 251, 255 to electrically connect the memory wafers together. With this stacked configuration, the capacity of the memory wafer may be doubled to include the capacity of two memory wafers. External connection may be made on the back sides of the wafers as in FIG. 4 or using edge connectors or a substrate module as shown above.

More wafers may be stacked than just the two shown. Alternatively, the wafers may be stacked so that the front side of one wafer is facing the back side of the other wafer. TSVs through a wafer may be allowed to create contact pads on the back side of the upper wafer as in FIG. 4. These pads may then be configured to connect to RDL on the front side of the lower wafer. In this way multiple wafers may be stacked together.

In the described examples, a package substrate and a system PCB that carries multiple memory dies may be eliminated. Instead of dicing and mounting memory chips on a system PCB, all or part of the SSD system may be carried on the wafer on which the memory circuitry was formed. The wafer may include memory controllers, power management, DRAM, etc. These components may all be physically and electrically connected directly to the wafer. Any components that are not formed on the wafer may be connected by applying an RDL or other buildup circuitry to the wafer or to the wafer encapsulant, or attached to the wafer backside using TSV's. As a result, the storage system integrates silicon and passives directly onto the silicon. The connections may be directly to silicon or almost directly to silicon through an RDL, interposers etc. This provides for higher speed signal propagation and reducing the size of the system by eliminating unnecessary substrate, PCB and supporting components, attachments, and connectors.

Figure 6:
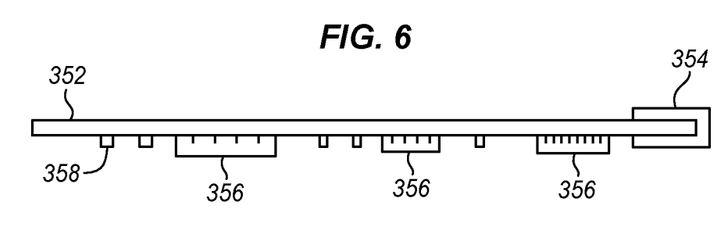
FIG. 6 is a side view diagram of a wafer level memory storage system with end connector according to an embodiment.

FIG. 6 is a side plan view diagram of an alternative memory wafer 352 suitable for use with a memory system. The memory wafer has a connector 354 to a system midplane at one end. The connector may be formed on the silicon or attached over the silicon wafer and connected through lands or through RDL. The memory wafer has multiple memory cells formed on the wafer. These may be 3D NAND flash cells, however, other types of solid state memory may be used including PCM (Phase Change Memory), STTM (Spin Transfer Torque Memory), magnetic, polymer, and other types of memory.

The memory wafer further includes memory controllers 356 attached to the back side in this case, but they may alternatively be attached to the front side or integrated into the memory wafer circuitry formed on the silicon substrate. The memory controllers control operations, manage cells, mapping, and read and write between the connector 354 and the memory cells on the wafer. The wafer may include fan out lines or hubs to connect the memory controllers to the memory cells and buffers to support write, read, wear leveling, and move operations. Passive components 358 may be formed in a separate process and attached to the memory wafer to provide capacitance or resistance for signaling and other purposes. The memory wafer may also have heat sinks (not shown) and be covered in encapsulant or any other type of suitable protective covering.

The particular configuration and arrangement of the circuits, cell, blocks and other structures on the memory wafer may be modified to suit requirements of different memory types and to match up with wiring routing layers within the wafer. Any buffers may be a part of the memory controllers or in addition to those in the memory controllers. There may be additional components (not shown) for system status and management. Sensors may be mounted to the wafer or formed in the wafer to report conditions to the memory controller or through the connector to an external controller or both.

The memory wafer allows a large amount of NAND flash and other types of memory to be packed into a small design. The amount may be reduced for lower cost, power, and heat and still use the same form factor. The memory wafer provides optimized airflow and a maximal surface area for storage media by allowing air to flow over the front side of the wafer. This provide a great advantage over existing form factors that were developed for other purposes, such as 2.5" notebook drives, AIC (Advanced Industrial Computer) memory, M.2 cards, and Gum-stick memory (typical USB stick style configurations) in which the front side of each die is covered by a package and arranged on PCBs that block or prevent air flow.

Figure 7:
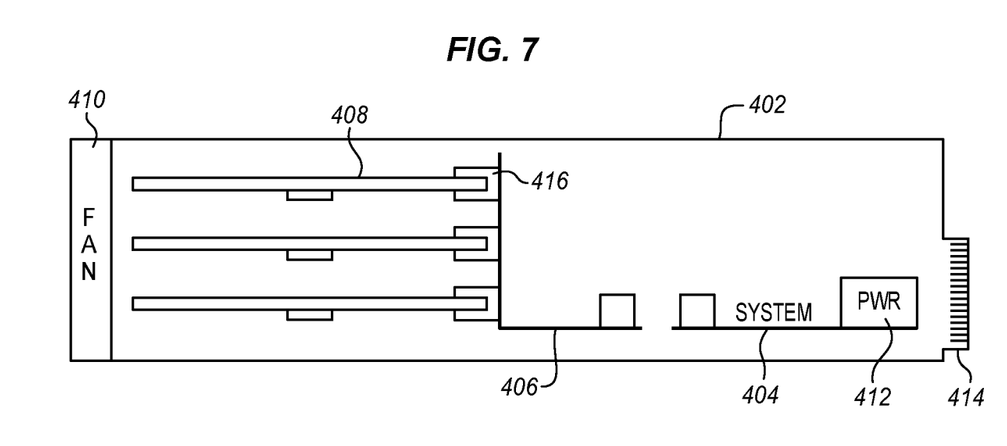
FIG. 7 is a cross-sectional side view diagram of a rack mount chassis and enclosure for a wafer level memory storage system according to an embodiment.

FIG. 7 is a cross-sectional side view diagram of an example of a rack-mount chassis and enclosure to accommodate the memory wafers as described herein. The system has an enclosure 402 which in this case is a 1U height rack mount enclosure. The enclosure is configured to mount in a particular type of standardized rack that has airflow from the front or left as shown in the diagram to the rear or right as shown in the diagram. The rear is configured for cabling. The enclosure is about 19" (483 mm) wide and 33" (840 mm) deep. The 1U form factor is 1.75" (44 mm) high. However, the particular width, height, and airflow direction may be adapted to suit other form factors.

The enclosure 402 carries a system module PCB (printed circuit board) 404 proximate the rear of the enclosure, a midplane PCB 406 near the middle of the enclosure and an array of memory wafers 408 proximate the front of the enclosure. An array of fans 410 is mounted to the front of the enclosure to draw air into the enclosure and push it between and across the memory wafers and to the rear of the enclosure. One or more power supplies 412 are mounted at the rear of the enclosure and may also have fans to draw air from the enclosure and push it out the rear of the enclosure. There may be additional fans along the chassis from front to rear. Rear fans may be used to pull air from the front across the chassis. Fans may be used in the middle of the chassis in addition to or instead of the front or rear fans to pull air in from the front and push it out the rear.

Many memory wafers may be mounted one above the other. While three memory wafers are shown, many more may be accommodated in a 44 mm 1U chassis height. Since each memory wafer is not much more than 1 mm thick, the primary limitation will be the size of any connectors and interfaces. The parallel memory cards extend toward the rear of the enclosure to a connector 416 that attaches to the edge connector described above. This connector 416 is part of a connection and switch fabric at the midplane 406. The rear of the enclosure 402 has power supply 412 and system management processing 404 between the memory card zone and a rear of the enclosure. An external connection interface 414 provides connections to other enclosures, through Ethernet, SCSI, or any other desired backplane connectors. There may be data, signaling and system management interfaces operated using different physical connections.

This basic design may be adapted in any of a variety of different ways. This system PCB 404 may also carry the switch fabric. In this case the midplane carries only a connector matrix to couple the power supply and management to the memory wafers. Alternatively, the system PCB or midplane 406 may also carry processing resources to perform computations using values stored in the memory wafers.

The system module 404 may be provided to suit different requirements, depending on the intended use of the system. The system module may be a data interface or a switching interface to connect the memory wafers to external connectors through wired or wireless interfaces. It may include a memory controller to manage access to the memory wafers and provide memory management and maintenance. It may include a data processing system to provide server, computing, and other functions between the memory wafers and external devices.

The midplane 106 provides a connection between the memory wafers and the system module, including a power interface to the memory wafers. The midplane may also provide memory management and mapping between the memory wafers and the system module.

The illustrated enclosure system may accordingly be adapted to suit different purposes. For example, a low power compute module, such as an Intel® Atom® processor-based system may be used for storage targets that need mid-range compute capabilities, such as Simple Block Mode Storage, NVMe of Fabrics, iSCSI/SER, Fiber Channel, NAS (Network Attached Storage), NFS (Network File System), SMB3 (Server Message Block), Object store, distributed file system etc. A higher performance processor on the compute module may be used for Ceph nodes, Open Stack Object, Custom Storage Services and Key/Value Stores. For very high performance, the computing module may be in a different enclosure on the same or another rack and connected using PCIe switches or another memory interface.

The memory module system and enclosure of FIG. 7 may be adapted to suit other form factors. A larger enclosure such as a 2U enclosure may be used to accommodate more memory wafers and more processing, interface, and switching capabilities. The configuration may also be adapted to suit any of a variety of other form factors. Alternatively, the memory wafer may be configured to be used as an add-in card for another system. A full size PCI slot, for example, is about 100 mm by 300 mm A 300 mm wafer may be used as a substrate for a memory wafer. The wafer may then be cut down to a width of 100 mm by removing about 100 mm from opposite sides. This results in a wafer that may be attached to a PCI slot.

Figure 8:
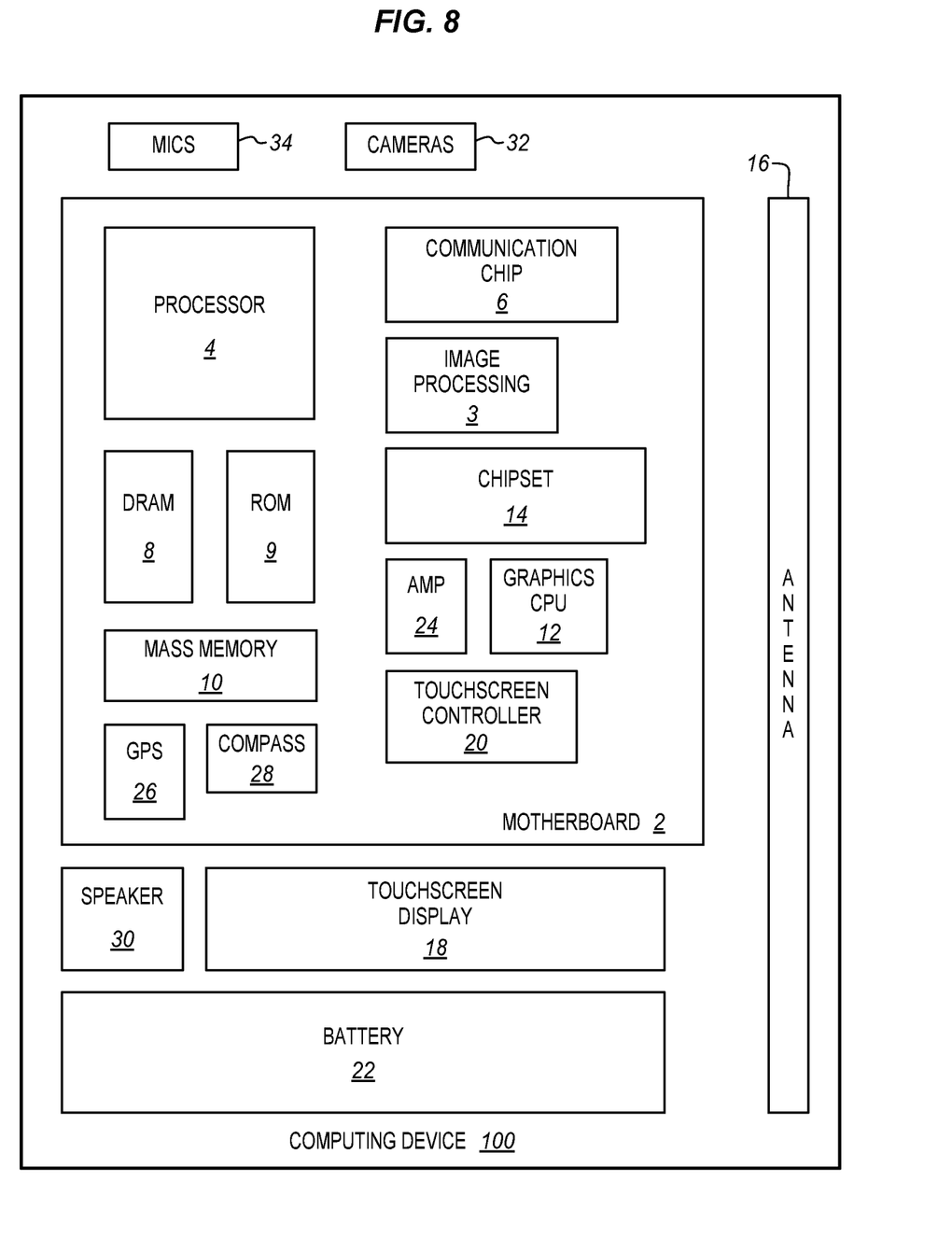
FIG. 8 is a block diagram of a computing device incorporating a memory system or capable of accessing a memory system according to an embodiment.

FIG. 8 is a block diagram of a computing device 100 in accordance with one implementation. The computing device 100 houses a system board 2. The board 2 may include a number of components, including but not limited to a processor 4 and at least one communication package 6. The communication package is coupled to one or more antennas 16. The processor 4 is physically and electrically coupled to the board 2.

Depending on its applications, computing device 100 may include other components that may or may not be physically and electrically coupled to the board 2. These other components include, but are not limited to, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a battery 22, an audio codec (not shown), a video codec (not shown), a power amplifier 24, a global positioning system (GPS) device 26, a compass 28, an accelerometer (not shown), a gyroscope (not shown), a speaker 30, a camera 32, a microphone array 34, and a mass storage device (such as hard disk drive) 10, compact disk (CD) (not shown), digital versatile disk (DVD) (not shown), and so forth). These components may be connected to the system board 2, mounted to the system board, or combined with any of the other components.

The communication package 6 enables wireless and/or wired communications for the transfer of data to and from the computing device 100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication package 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 100 may include a plurality of communication packages 6. For instance, a first communication package 6 may be dedicated to shorter range wireless communications such as Wi-Fi and Bluetooth and a second communication package 6 may be dedicated to longer range wireless communications such as GPS, EDGE, GPRS, CDMA, WiMAX, LTE, Ev-DO, and others.

The computing system may be configured to be used as the system module. The computing system also reflects the entire rack-mount memory system where the mass memory is formed from multiple memory wafers, as described. The memory system may have multiple iterations of the computing system within a single enclosure for each system module and also for the overall system.

In various implementations, the computing device 100 may be an entertainment front end unit or server, a music or video editing station or back end, a cloud services system, a database, or any other type of high performance or high density storage or computing system.

Embodiments may be include one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to an apparatus that includes a silicon wafer, a plurality of memory cells formed directly on the wafer, an encapsulant formed over the memory cells, a plurality of wiring connections to connect the memory cells to an external interface, a memory controller, and an external interface.

In further embodiments the wiring connections comprise conductive lines formed directly on the wafer between the memory cells.

In further embodiments the wiring connections comprise a redistribution layer formed over the memory cells on the wafer.

In further embodiments the wiring connections comprise a dielectric layer over the memory cells, and a wiring layer formed over the dielectric layer and connected to the memory cells using vias through the dielectric layer.

In further embodiments the memory controller is attached to the wafer over the wiring layer and electrically connected to the wiring layer.

In further embodiments the encapsulant is formed over the wiring connections.

In further embodiments the memory controller is formed directly on the wafer.

In further embodiments the memory controller is formed near a center of the wafer and the memory cells are formed around the controller.

In further embodiments the memory cells are formed as sectors surrounding the memory cells.

Further embodiments include a frame attached to the wafer on a side opposite the wafer.

Some embodiments pertain to an apparatus that includes a silicon wafer, a plurality of memory cells formed directly on the wafer, an encapsulant formed over the memory cells, a plurality of wiring connections to connect the memory cells to an external interface, a memory controller attached to the wafer and connected to the memory cells over the wiring connections, and an external interface.

In further embodiments the external interface is formed directly on the wafer and connected to the memory controller.

Further embodiments include a circuit board attached to an edge of the wafer and connected to the memory controller, the circuit board carrying the external interface.

In further embodiments the circuit board further carries the memory controller.

Some embodiments pertain to a memory system that includes an enclosure configured to mount in a rack, the enclosure having a front configured to receive airflow and a rear configured for cabling, a backplane board in the enclosure having a memory connector and an external interface, the backplane board having a first side proximate the front of the enclosure and a second opposite side having the external interface, a memory card comprising a silicon wafer, a plurality of memory cells formed directly on the wafer, an encapsulant formed over the memory cells, a plurality of wiring connections to connect the memory cells to an external interface, a memory controller, and an external interface coupled to the memory connector of the backplane board, and a cabling interface at the rear of the enclosure coupled to the external connector.

In further embodiments the memory card is horizontal with respect to the rack and the airflow passes across the memory card.

Further embodiments include a plurality of additional memory cards arranged horizontally above the first memory card.

Further embodiments include a system board, a computing platform mounted to the system board, and a switching fabric coupled between the backplane board and system board and wherein the computing platform is mounted to the system board.

In further embodiments the computing platform determines status including fault conditions of the memory card and sends status data to a memory controller to write on a status display.

In further embodiments a display controller writes to the display when the apparatus is powered and the display maintains the status data after power is removed from the apparatus.

The invention claimed is:

1. An apparatus comprising:
a silicon wafer;
a plurality of memory cells formed directly on the silicon wafer;
an encapsulant formed over the memory cells;
a plurality of wiring connections to connect the memory cells to a bumped attachment;
a substrate module vertically over the memory cells and coupled to the memory cells by the bumped attachment, the substrate module comprising an external interface; and
a memory controller.

2. The apparatus of claim 1, wherein the wiring connections comprise conductive lines formed directly on the silicon wafer between the memory cells.

3. The apparatus of claim 1, wherein the wiring connections comprise a redistribution layer formed over the memory cells on the silicon wafer.

4. The apparatus of claim 1, wherein the wiring connections comprise a dielectric layer over the memory cells, and a wiring layer formed over the dielectric layer and connected to the memory cells using vias through the dielectric layer.

5. The apparatus of claim 4, wherein the memory controller is attached to the silicon wafer over the wiring layer and electrically connected to the wiring layer.

6. The apparatus of claim 1, wherein the encapsulant is formed over the wiring connections.

7. The apparatus of claim 1, wherein the memory controller is formed directly on the silicon wafer.

8. The apparatus of claim 1, wherein the memory controller is formed near a center of the silicon wafer and the memory cells are formed around the controller.

9. The apparatus of claim 8, wherein the memory cells are formed as sectors surrounding the memory controller.

10. The apparatus of claim 1, further comprising a frame attached to the silicon wafer.

11. An apparatus comprising:
a silicon wafer;
a plurality of memory cells formed directly on the silicon wafer;
an encapsulant formed over the memory cells;
a substrate module vertically over the memory cells and coupled to the memory cells by a bumped attachment, the substrate module comprising an external interface; and
a plurality of wiring connections to connect the memory cells to the bumped attachment, the plurality of wiring connections between the substrate module and the memory cells;
a memory controller connected to the memory cells over the wiring connections, the memory controller included in the substrate module.

12. The apparatus of claim 11, further comprising a circuit board attached to an edge of the silicon wafer and connected to the memory controller, the circuit board carrying the external interface.

13. The apparatus of claim 12, wherein the circuit board further carries the memory controller.

14. A memory system comprising:
an enclosure configured to mount in a rack, the enclosure having a front configured to receive airflow and a rear configured for cabling;
a backplane board in the enclosure having a memory connector and an external interface, the backplane board having a first side proximate the front of the enclosure and a second opposite side having the external interface;
a memory card comprising a silicon wafer, a plurality of memory cells formed directly on the silicon wafer, an encapsulant formed over the memory cells, a plurality of wiring connections to connect the memory cells to a bumped attachment, a substrate module vertically over the memory cells and coupled to the memory cells by the bumped attachment, the substrate module comprising an external interface, and the memory card comprising a memory controller, the external interface coupled to the memory connector of the backplane board; and
a cabling interface at the rear of the enclosure coupled to the external connector.

15. The system of claim 14, wherein the memory card is horizontal with respect to the rack and the airflow passes across the memory card.

16. The system of claim 15, further comprising a plurality of additional memory cards arranged horizontally above the first memory card.

17. The system of claim 14, further comprising a system board, a computing platform mounted to the system board, and a switching fabric coupled between the backplane board and system board and wherein the computing platform is mounted to the system board.

18. The system of claim 15, wherein the computing platform determines status including fault conditions of the memory card and sends status data to the memory controller to write on a status display.

19. The system of claim 16, wherein a display controller writes to the display when the apparatus is powered.

* * * * *